United States Patent [19]

Hayes et al.

[11] Patent Number: 4,935,695

[45] Date of Patent: Jun. 19, 1990

[54] BOARD ALIGNMENT SYSTEM

[75] Inventors: James M. Hayes; Kris J. Kanack, both of Loveland, Colo.

[73] Assignee: Hewlett-Packard Company, Palo Alto, Calif.

[21] Appl. No.: 453,144

[22] Filed: Dec. 12, 1989

Related U.S. Application Data

[63] Continuation of Ser. No. 219,033, Jul. 13, 1988, abandoned.

[51] Int. Cl.⁵ .................... G01R 31/02; G01R 1/06
[52] U.S. Cl. ............................ 324/158 F; 324/158 P
[58] Field of Search ............... 324/158 F, 158 P, 72.5, 324/158 R

[56] References Cited

U.S. PATENT DOCUMENTS 3,996,516 12/1976 Luther .............................. 324/158 P
4,701,702 10/1987 Kruger ............................. 324/158 P

FOREIGN PATENT DOCUMENTS 0255909 2/1988 European Pat. Off. ......... 324/158 F
0150351 8/1984 Japan ............................... 324/158 F Primary Examiner—Ernest F. Karlsen

[57] ABSTRACT

A board alignment system is provided for a printed circuit board test system wherein at least two spring biased alignment pins have body portions and first and second ends and the second end is tapered to a diameter smaller than the diameter of the body portion. A printed circuit board to be aligned has alignment holes having a diameter larger than the smaller diameter and smaller than the diameter of the body portion.

14 Claims, 10 Drawing Sheets

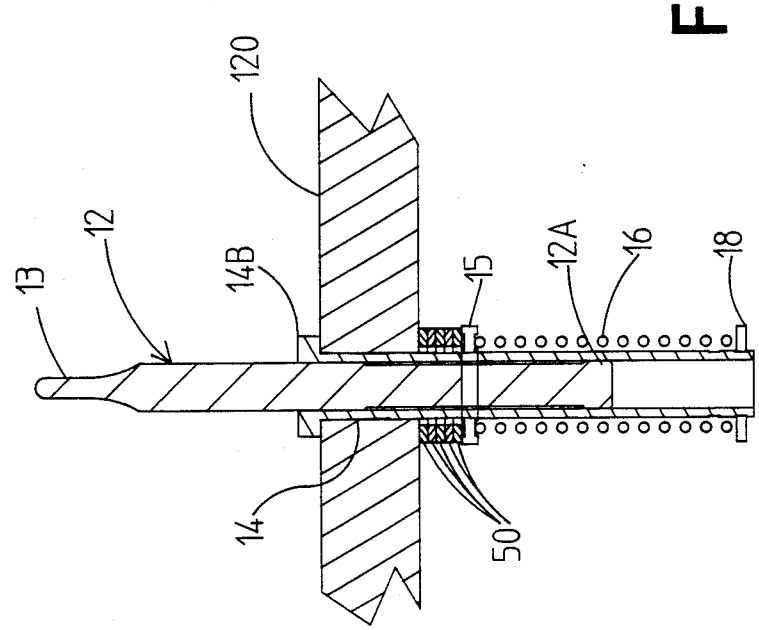

BOARD ALIGNMENT SYSTEM

This application is a continuation, of application Ser. No. 219,033, filed July 13, 1988, now abandoned.

FIELD OF THE INVENTION

This invention relates to testing of printed circuit boards. More particularly, this invention relates to systems and techniques for aligning a printed circuit board with testing apparatus.

BACKGROUND OF THE INVENTION

In automated testing of printed circuit boards it is necessary to align the printed circuit board with the probes of the test fixture. Conventionally this may be done by means of alignment holes in the printed circuit board which are adapted to be aligned with alignment pins carried by the fixture.

Prior art printed circuit board fixtures have used alignment pins which are of uniform diameter along their length and have a fixed length. The diameter of the alignment pins must be closely sized to the diameter of the alignment holes in the printed circuit board to ensure proper positioning of the board for testing. This is necessary because the probes of the testing unit must contact the proper electronic devices and electrical contacts on the board in order for reliable testing to be conducted.

However, exact positioning of the board is not possible due to clearances between the alignment holes in the printed circuit board and alignment pins in the test fixture. These clearances must exist due to manufacturing tolerances in the diameter and position of the alignment holes in the printed circuit board and alignment pins in the test fixture.

If tolerances are not held closely this requires that the alignment pins be undersized, and therefore the printed circuit board is not held in proper alignment and can shift from the ideal position. If the alignment pins are oversized the printed circuit board may bind on the alignment pins. As a result, the printed circuit board cannot be placed into proper position for testing.

Thus, it has been necessary to maintain proper selection of alignment pins, and also maintain proper tolerances, to assure that a printed circuit board is properly aligned in the fixture for desired testing.

SUMMARY OF THE INVENTION

In accordance with the present invention there is provided a board alignment system for alignment of a printed circuit board in a test fixture. The alignment system comprises a telescoping pin having one end supported or carried by the test fixture and the other end projecting outwardly. The distal end of the pin is tapered to a smaller diameter than the body portion of the pin.

The pin is adapted to telescope between a normally extended position and a retracted position. Bias means (e.g., a coiled spring) urges the pin toward its normally extended position.

Because the other or distal end of the pin is tapered (i.e., of a smaller diameter), it can easily be started into the alignment holes in the printed circuit board (even when the board is slightly out of proper position and even when the alignment holes are under-sized). The spring force urges the tapered end of the pin into the alignment holes regardless of the diameter of the hole. Thus, tolerance problems are avoided. Also, the diameter of the alignment hole is not critical. Further, small target areas on the printed circuit board can be contacted with probes for testing because of the greater accuracy in alignment of the board in the test fixtures. Greater accuracy in alignment is possible due to the elimination of clearance between the alignment holes in the printed circuit board and the tapered alignment pins.

A further advantage of the present invention is that a wide range of printed circuit board hole diameters can be accommodated with the novel alignment pin assembly.

This arrangement also enables larger diameter alignment pins to be used. The larger diameter pins are stiffer than normal alignment pins. Consequently, the test assembly is stiffer than when using conventional pins.

Other advantages of the alignment system of the invention will be apparent from the following detailed description and the accompanying drawings.

BRIEF DESCRIPTION OF THE DRAWINGS

The invention is described in more detail hereinafter with reference to the accompanying drawings, wherein like reference characters refer to the same parts throughout the several views and in which:

FIG. 9 is an elevational, cross-sectional view of another embodiment of alignment pin assembly of this invention.

DETAILED DESCRIPTION OF THE INVENTION

Figure 1:
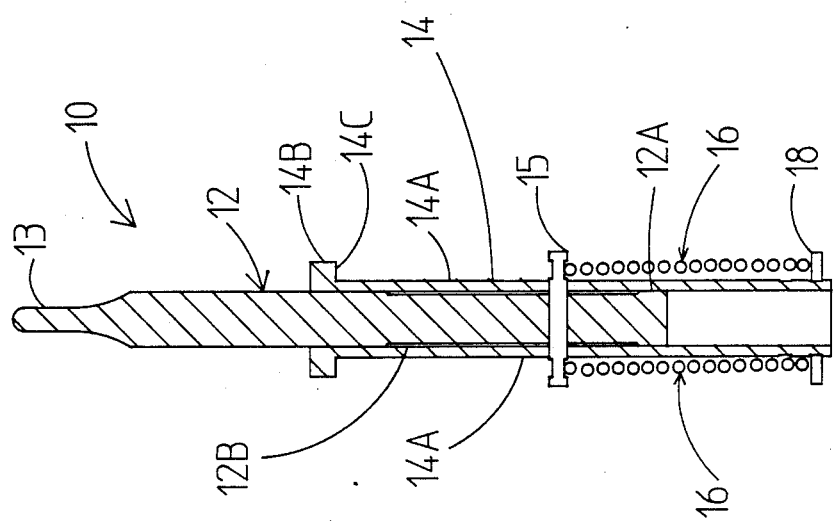
FIG. 1 is an elevational, cross-sectional view of one embodiment of a telescoping alignment pin assembly useful in this invention.

In FIG. 1 there is shown an elevational, partially cutaway view of one embodiment of a telescoping alignment pin 10 of the invention. Elongated pin member 12 is slidably received in an elongated tubular housing 14. The upper end 13 of the pin is tapered to a smaller diameter than the main body portion of the pin.

The pin 12 is closely received in housing 14 in a manner such that the pin can move longitudinally with respect to housing 14 without binding. Yet, the fit between the pin and the interior of the housing is sufficiently close that the pin cannot wobble or move laterally within the housing. A portion 12B of the pin 12 may be removed as shown so that there is no possibility of binding between this portion and the interior of the housing. The end 12A of the pin is of the same diameter as the main body portion of the pin.

A horizontal pin or shaft 15 passes through a transverse opening in pin 12, as shown, and the outer ends of the shaft serve as stop means for the upper end of coiled spring 16 which encircles housing 14. Stop means 18 is secured at the lower end of the tubular housing 14 to secure the lower end of spring 16. Stop means 18 may be, for example, a spring clip which is detachably secured to the lower end of the housing 14.

The upper end of the housing 14 includes an enlarged shoulder 14B which has a face 14C which is perpendicular to the longitudinal centerline of the housing. This shoulder and face assure that the housing is properly oriented when it is mounted in an opening in a substrate (such as a probe plate in a test fixture).

The external surface also includes a plurality of barbs 14A which assist in securing the housing in the desired substrate. The barbs ensure centering and perpendicularity of mounting the housing in the substrate.

The housing includes slotted apertures in opposing side walls of the housing through which the ends of shaft 15 project. When downward pressure is exerted on the end 13 of pin 12, the pin 12 can be urged downwardly in the housing against the force of the coiled spring 16. When the force is removed from pin 12 the spring 16 urges the pin upwardly again to its uppermost position.

Figure 6:
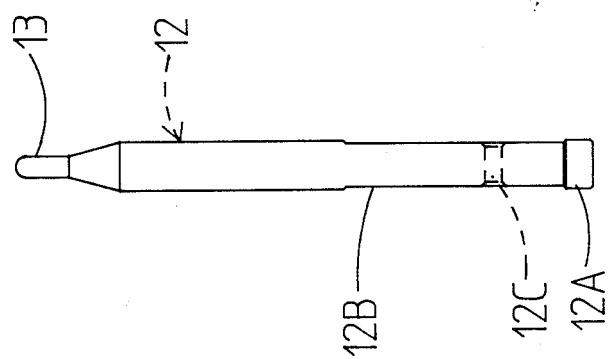
FIG. 6 is a front elevational view of another embodiment of alignment pin useful in the invention.

FIG. 6 is a front elevational view of the pin 12. Aperture 12C extends transversely through the pin to receive shaft 15.

Figure 2:
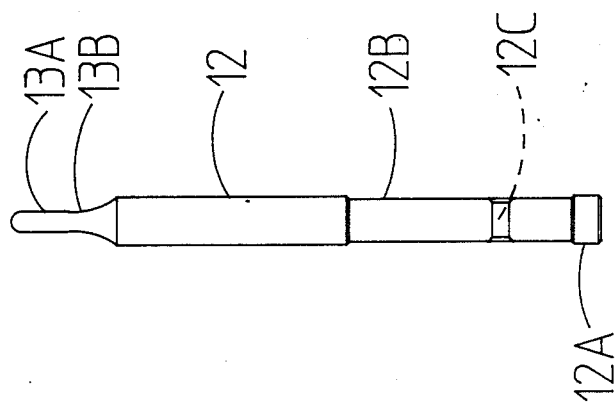
FIG. 2 is a front elevational view of one embodiment of an alignment pin which is useful in this invention.
Figure 3:
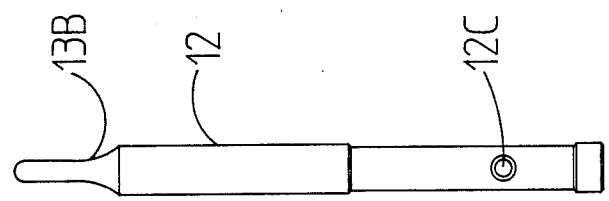
FIG. 3 is a side elevational view of the alignment pin of FIG. 2.

FIG. 2 is a front elevational view of another embodiment of pin member 12 having a different type of tapered end 13A. In this embodiment the taper includes a curved surface 13B (as opposed to the linear slope of the tapered end of the embodiment shown in FIG. 1). FIG. 3 is a side elevational view of the embodiment shown in FIG. 2.

Figure 4:
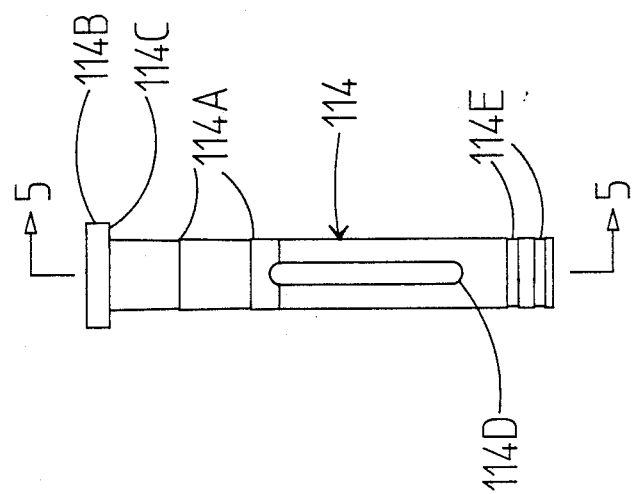
FIG. 4 is a side elevational view of a preferred embodiment of guide bushing used in the assembly of the invention.
Figure 5:
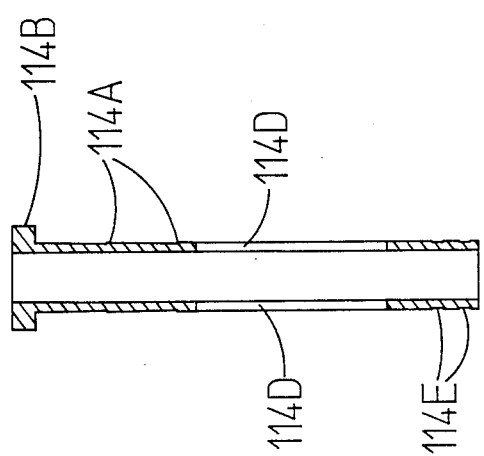
FIG. 5 is a cross-sectional view of the guide bushing shown in FIG. 4, taken along line 5—5.

FIG. 4 is a side elevational view of another embodiment of tubular housing 114 having an enlarged shoulder 114B which includes a face 114C which is perpendicular to the longitudinal centerline of the housing. The external surface of the housing includes a plurality of barbs 114A. FIG. 5 is a cross-sectional view of the housing taken along line 5—5 in FIG. 4.

The housing 114 also includes an elongated slotted aperture 114D in each of two opposing side walls of the housing. One end of the housing includes recessed grooves 114E, as illustrated. The purpose of these grooves is for the placement of a clip member to retain the lower end of a coiled spring as illustrated in FIG. 1. By having more than one groove 114E, the clip member could be placed on the housing at either location. By placing the clip in the upper groove the spring is compressed more than when the clip is placed in the lower groove. This then provides more upward force against the pin member.

Figure 7:
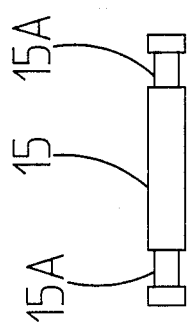
FIG. 7 is a side elevational view of a preferred embodiment of stop member useful in the assembly of the invention.

FIG. 7 is a front elevational view of a preferred embodiment of shaft 15 which is useful as a stop member for the upper end of spring 16, as illustrated in FIG. 1. Each end of the shaft includes a recessed groove or channel 15A to assist in retaining the upper end of the coiled spring 16 in proper position.

Figure 8:
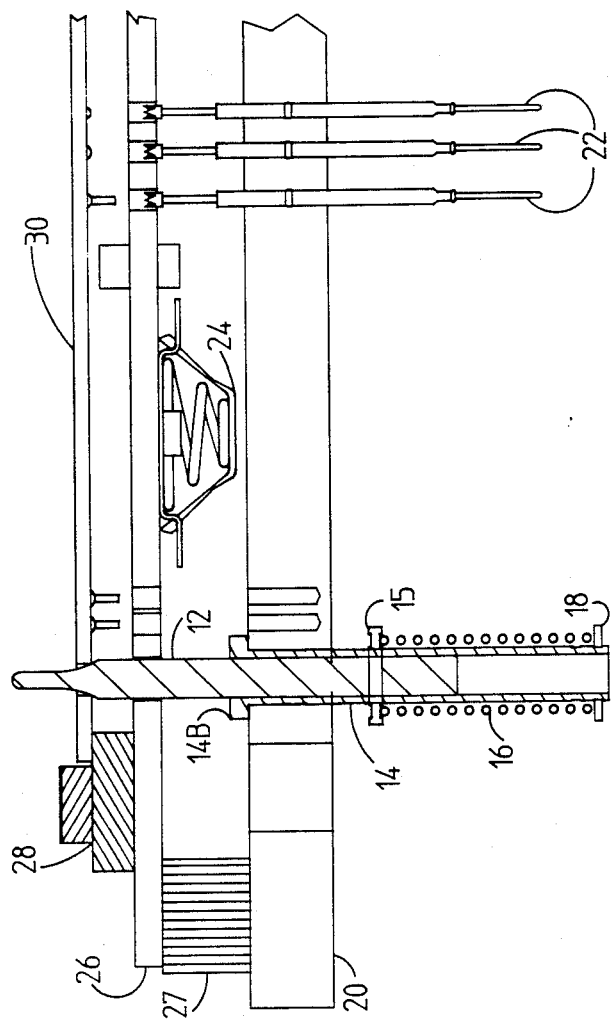
FIGS. 8 and 8A are side elevational, partially cutaway, views illustrating use of alignment assemblies of the invention mounted in a fixture, with a printed circuit board placed over the pins for alignment purposes.
Figure 8A:
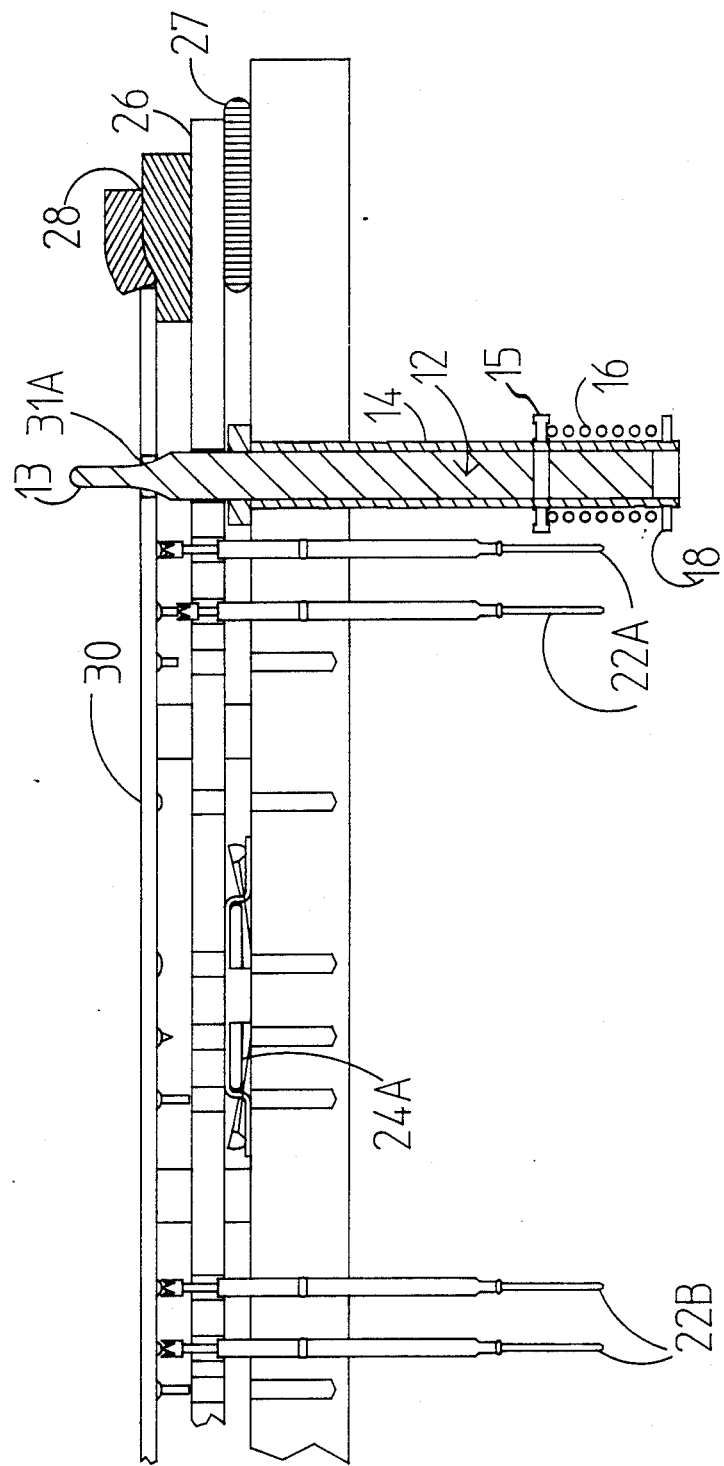

As illustrated in FIGS. 8 and 8A, the alignment pin assembly of the invention can be carried by a probe plate in a board testing fixture. Normally there are two or more such alignment pin assemblies used in such a probe plate. When two such alignment pins are used they are placed at opposite diagonal corners of the fixture.

FIG. 8 illustrates one corner section of the testing fixture in which an alignment pin assembly 10 is used. In this view the pin is in its fully extended position. FIG. 8A illustrates the opposite corner section of the testing fixture of FIG. 8 after vacuum has been drawn to force the printed circuit board downwardly against the test probes and the alignment pin.

The tubular housing or guide bushing 14 is inserted into an opening in probe plate 20, as illustrated. The housing has a length greater than the thickness of the probe plate so that the housing extends completely through the probe plate. The upper end 13 of pin 12 extends into an alignment or tooling hole 31 in printed circuit board 30.

Gasket 27 is positioned between the edge of the probe plate and the support plate 26, and gasket 28 is positioned between the edge of printed circuit board 30 and the upper surface of support plate 26. A pre-loaded spring 24 is positioned between the support plate and the probe plate. The pre-loaded spring urges the support plate upwardly away from the probe plate.

Probes 22 are carried by the probe plate and extend through openings in support plate 26. When the printed circuit board is drawn downwardly toward the probe plate by vacuum, the upper ends of the probes contact the appropriate electronic devices or contacts on the printed circuit board for testing.

FIG. 8A illustrates the assembly after the printed circuit board has been forced downwardly by atmospheric pressure due to a vacuum being created between the probe plate and the board. The various probes 22A and 22B are in contact with the appropriate contacts on the board for testing purposes. Spring 24A is in collapsed position. Alignment pin 12 has been forced downwardly into housing 14. Coiled spring 16 pushes upwardly to urge pin 12 against the board 30. The tapered end 13 of pin 12 centers itself in the opening 31A in board 30. In other words, the tapered end of pin 12 engages the opening 31A and thereby removes clearance or gaps between the pin and the opening. As illustrated, the body portion of the pin is of a larger diameter than the diameter of the opening.

In the alignment pin assembly of the invention it is preferable that at least about 50% of the length of the moveable pin be disposed within the tubular housing at all times. This assures that the pin will be properly supported and will not wobble or otherwise move laterally relative to the housing. Movement of the pin should only be in the longitudinal direction.

The length of the pin and the housing may vary. Typically the length of the pin is in the range of about 1 to 3 inches. At least about 50% (and more preferably about 70%) of the length of the pin is disposed within the housing at all times. If desired, a portion of the length of the pin within the housing may include a recess (as illustrated in FIGS. 1, 2, 3 and 6). In such event, however, the lower end of the pin must be the same diameter as the main body portion of the pin so as to maintain proper alignment of the pin within the housing.

The lower end of the housing may be open, if desired.

As illustrated in FIG. 9, it is possible to place washers or spacers 50 between the stop 15 and the bottom side of the mounting substrate (e.g., probe plate 120) in order to partially compress spring 16. This results in an adjustment of the uppermost position of pin 12. In other words, by placing washers or spacers around housing 14 next to the mounting substrate, the pin 12 is limited in its upward travel (because stop 15 is limited in its upward travel). In this manner the spacers serve as adjustment means for adjusting the outermost position of the pin relative to the housing.

Other variants are possible without departing from the scope of this invention.

What is claimed is:

1. Board alignment system for alignment of a printed circuit board in a test fixture, wherein said printed circuit board includes at least two alignment openings therein, said alignment system comprising at least two pin members each comprising an elongated body portion having first and second ends, wherein said second end is tapered to a diameter smaller than the diameter of said body portion, wherein said first end of each said pin member is supported by said fixture;

wherein said second end of each said pin member projects outwardly; wherein each said pin member is adapted to telescope between a normally extended position and a retracted position; said system further comprising bias means adapted to urge each said pin member toward said normally extended position;

wherein said body portion of each said pin member has a diameter larger than the diameter of a said alignment opening; wherein said second end of each said pin member is adapted to engage a said alignment opening and remove clearance between said second end of said pin member and said opening.

2. An alignment system in accordance with claim 1, wherein said bias means comprises a coiled spring.

3. An alignment system in accordance with claim 1, further comprising at least two tubular housings secured to said fixture; wherein each said housing has an open end; wherein each said first end of said pin member is slidably received in said open one end of said housing.

4. An alignment system in accordance with claim 3, wherein said bias means comprises a spring.

5. An alignment system in accordance with claim 4, further comprising first and second stop members associated with each said pin member; wherein said first stop member is carried by said housing and said second stop member is carried by said first end of said pin member; wherein each said housing includes a wall having a longitudinal, elongated, slotted aperture therein; wherein said second stop member projects through said slotted aperture; and wherein said spring is retained between said first and second stop member.

6. An alignment system in accordance with claim 5, wherein each said housing includes two said slotted apertures which are disposed on opposite sides of said housing; wherein said second stop member carried by said pin member projects outwardly through each of said slotted apertures; and wherein said spring comprises a coiled spring which encircles said tubular housing.

7. An alignment system of accordance with claim 3, wherein at least about 50% of the length of said pin member remains in said tubular housing when said pin member is in said extended position.

8. A method for aligning a printed circuit board in a test fixture, wherein said printed circuit board includes at least two alignment openings therein; said method comprising the steps of:

(a) providing at least two biased pin members each comprising an elongated body portion having first and second ends, wherein said second end is tapered to a diameter smaller than the diameter of said body portion, wherein said first end of each said pin member is supported by said fixture; wherein said second end of each said pin member projects outwardly; wherein each said pin member is adapted to move between a normally extended position and a retracted position; said system further comprising bias means adapted to urge each said pin member toward said normally extended position; wherein said body portion of said pin member has a diameter larger than the diameter of a said alignment opening;

(b) placing said printed circuit board adjacent said fixture in a manner such that said second ends of said pin members engage said alignment openings in said board;

(c) urging said printed circuit board toward said fixture in a manner such that said pin members align said board with said fixture by removing clearance between said second ends of said pin members and said openings.

9. A method in accordance with claim 8, wherein said bias means comprises a coiled spring.

10. A method in accordance with claim 8, further comprising at least two tubular housings secured to said fixture; wherein each said housing has an open end; wherein said first end of each said pin member is slidably closely received in said open end of a respective tubular housing.

11. A method in accordance with claim 10, further comprising first stop members carried by each said housing and second stop members carried by said first ends of said pin members; wherein each said housing includes a wall having a longitudinal, elongated, slotted aperture therein; and wherein each said second stop member projects through a said slotted aperture of a respective housing.

12. A method in accordance with claim 8, wherein said printed circuit board is urged toward said fixture by means of vacuum between said board and said fixture.

13. Board alignment system for alignment of a printed circuit board in a test fixture, wherein said board includes at least two alignment openings therein; said alignment system comprising:

(a) at least two elongated tubular housings each having first and second ends, said first end being open; wherein each said housing is adapted to be carried by said fixture;

(b) at least two elongated pin members each comprising an elongated body portion having first and second ends, wherein said second end is tapered to a diameter smaller than the diameter of said body portion; wherein said first end of each said pin member is slidably closely received in said open end of a respective tubular housing; wherein said body portion of each said pin member has a diameter larger than the diameter of a said alignment opening;

(c) bias means adapted to urge each said pin member to a normally extended position;

wherein each said member is adapted to retract into one said tubular housing in response to force applied to said second end of said pin member; wherein said second end of each said pin member is adapted to engage one of said openings in said printed circuit board and align said board with respect to said fixture by removing clearance between said second ends of said pin members and said openings.

14. An alignment system in accordance with claim 13, wherein said bias means comprises a coiled spring; wherein said system further comprises first and second stop members associated with each said pin member; wherein said first stop member is carried by a said housing and said second stop member is carried by said first end of said pin member; wherein each said housing includes a wall having a longitudinal, elongated, slotted aperture therein; wherein said second stop member projects through said slotted aperture; and wherein said spring is retained between said first and second stop members.

* * * * *